(12) United States Patent
Yeo

(10) Patent No.: US 8,943,115 B1
(45) Date of Patent: *Jan. 27, 2015

(54) BITWISE COMPARATOR FOR SELECTING TWO SMALLEST NUMBERS FROM A SET OF NUMBERS

(75) Inventor: Engling Yeo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 354 days.

This patent is subject to a terminal disclaimer.

(21) Appl. No.: 13/545,652

(22) Filed: Jul. 10, 2012

Related U.S. Application Data

(63) Continuation of application No. 12/256,702, filed on Oct. 23, 2008, now Pat. No. 8,234,320.

(60) Provisional application No. 60/982,547, filed on Oct. 25, 2007.

(51) Int. Cl.
*G06F 7/00* (2006.01)
*G06F 15/00* (2006.01)
*H03M 13/00* (2006.01)
*G06F 11/00* (2006.01)

(52) U.S. Cl.
USPC ............................ 708/207; 714/752; 714/800

(58) Field of Classification Search
USPC ........................................................ 708/207
See application file for complete search history.

(56) References Cited

U.S. PATENT DOCUMENTS

| 3,660,823 | A | * | 5/1972 | Recks | ......................... | 340/146.2 |
| 4,410,960 | A | | 10/1983 | Kasuya | | |
| 5,122,979 | A | | 6/1992 | Culverhouse | | |
| 5,534,844 | A | * | 7/1996 | Norris | ........................ | 340/146.2 |
| 5,630,160 | A | | 5/1997 | Simpson et al. | | |
| 5,721,809 | A | | 2/1998 | Park | | |
| 5,894,426 | A | * | 4/1999 | Ju | .................................. | 708/207 |
| 6,748,405 | B2 | | 6/2004 | de Tremiolles et al. | | |
| 6,772,187 | B1 | | 8/2004 | Ott et al. | | |
| 7,603,607 | B2 | * | 10/2009 | Maehata | ....................... | 714/752 |
| 7,631,250 | B2 | | 12/2009 | Liao et al. | | |
| 8,077,812 | B2 | | 12/2011 | Graef et al. | | |
| 2006/0242533 | A1 | * | 10/2006 | Lee et al. | ....................... | 714/758 |
| 2008/0263123 | A1 | * | 10/2008 | Penzes | ......................... | 708/671 |
| 2009/0164540 | A1 | | 6/2009 | Oh et al. | | |
| 2011/0191398 | A1 | | 8/2011 | Mueller | | |

OTHER PUBLICATIONS

J.-Y Kim and H.-J. Yoo, "Bitwise competition logic for compact digital comparator", Proc. IEEE Asian Solid-States Circuits Conf., pp. 59-62, 2007.*

(Continued)

*Primary Examiner* — Chat Do
*Assistant Examiner* — Matthew Sandifer

(57) ABSTRACT

A group of numbers from which the smallest and second-smallest are to be selected are compared in a cascaded tree. Each comparison stage will select the smallest number from two numbers output by the previous stage, into which four numbers are input. The second-smallest number is one of the other three inputs to the previous stage and, as before, all bits of the second-smallest number will not be known until the smallest number is determined. However, because at each stage of the determination, the next stage is reached because the bit values being examined are the same, those bit values of the second-smallest number (and indeed of the smallest number) are known ahead of the final determination of the smallest number. Accordingly, one can begin to output bits of the second-smallest number (as well as of the smallest number) even before that final determination.

14 Claims, 12 Drawing Sheets

(56) References Cited

OTHER PUBLICATIONS

A. I. Grushin, "Fast minimum and maximum selection", In Proceedings of the 23th International Conference on Computer Design, pp. 511-518, 2005.*

Gunnam, K.K. et al., "A Parallel VLSI Architecture for Layered Decoding for Array LDPC Codes," *International Conference on VLSI Design* pp. 738-743, 2007.

Darabiha, A. et al., "A Bit-Serial Approximate Min-Sum LDPC Decoder and FPGA Implementation," *Proc. IEEE Int. Symp. Circuits and Systems* (ISCAS '06), 2006.

* cited by examiner

BITWISE COMPARATOR FOR SELECTING TWO SMALLEST NUMBERS FROM A SET OF NUMBERS

CROSS REFERENCE TO RELATED APPLICATIONS

This is a continuation of, commonly-assigned U.S. patent application Ser. No. 12/256,702, filed Oct. 23, 2008 (now U.S. Pat. No. 8,234,320), which claims the benefit of commonly-assigned U.S. Provisional Patent Application No. 60/982,547, filed Oct. 25, 2007, each of which is hereby incorporated by reference herein in its respective entirety.

BACKGROUND

This invention relates to a method and system for selecting the two smallest numbers from a set of multibit numbers more quickly than has heretofore been possible.

When searching for the minimum of two multibit binary numbers that are unsigned (so that the most significant bit of each number represents magnitude information rather than sign information), one can begin the comparison of the numbers at the most significant bit (MSB). If the MSB of a first number is a "1" and the MSB of a second number is a "0", then the second number is smaller than the first number and therefore is the minimum as between those two numbers. If the two MSBs are the same (whether "0" or "1"), then evaluation of the next MSB is necessary and so on until a bit position is reached at which the bits are not the same.

Extending this to selecting a minimum of three or more unsigned multibit binary numbers, the numbers can be evaluated in pairs in tournament-ladder fashion, with the candidates narrowed by half at each stage. At each stage, a plurality of pairs is evaluated simultaneously, and the duration of each stage is the duration of the longest comparison in that stage, which in turn is the comparison that requires evaluation of the greatest number of bits until bits that are not identical are found—i.e., the longest comparison is for the pair in which the two numbers have the greatest number of identical MSBs.

For some applications, it is necessary to find not only the smallest number in a group of numbers, but also the second-smallest number—i.e., the problem presented is to find the two smallest numbers in a set of numbers. In the process described above, the second-smallest number may be the result of the comparison in one of the pairs from which the smallest number was not selected. Alternatively, it may be that the other number in the pair from which the smallest number was selected, while larger than the smallest number, is nevertheless smaller than any of the other comparison results and therefore is the second-smallest number. Thus to select the second-smallest number requires comparing the other number in the pair from which the smallest number was selected, and all of the results of the comparisons in the pairs from which the smallest number was not selected. Typically, this is done in a cascaded tree, and therefore the required comparison is between the other number in the pair from which the smallest number was selected, and the result of one other comparison. Even so, however, that comparison heretofore could not be made until the determination of the smallest number had been made.

SUMMARY

In accordance with the present invention, the group of numbers from which the smallest and second-smallest are to be selected are compared in a cascaded tree. Each comparison stage will select the smallest number from two numbers output by the previous stage, into which four numbers are input. The second-smallest number is one of the other three inputs to the previous stage and, as before, all bits of the second-smallest number will not be known until the smallest number is determined. However, because at each stage of the determination, the next stage is reached because the bit values being examined are the same, those bit values of the second-smallest number (and indeed of the smallest number) are known ahead of the final determination of the smallest number. Accordingly, one can begin to output bits of the second-smallest number (as well as of the smallest number) even before that final determination.

Therefore, in accordance with the present invention, there is provided a method of determining a minimum and a next-to-minimum value from an original group of values. The method includes in a first stage, dividing the group of values into subgroups of values. For each subgroup, minimum and next-to-minimum values in the subgroup are determined, and bitwise comparators are used to determine which of the minimum and next-to-minimum values is the minimum value and which of the minimum and next-to-minimum values is the next-to-minimum value of the subgroup. The determined minimum and next-to-minimum values from the subgroup are aggregated into a new group, and in one or more subsequent stages, the determining, the using of bitwise comparators and the aggregating, are repeated until the new group includes only a minimum value and a next-to-minimum value from the original group. In this method, the using of bitwise comparators comprises propagating, from a current stage to a subsequent stage, bits of the minimum value and the next-to-minimum value in bitwise fashion prior to completing determination of the minimum value and the next-to-minimum value.

BRIEF DESCRIPTION OF THE DRAWINGS

Further features of the invention, its nature and various advantages, will be apparent upon consideration of the following detailed description, taken in conjunction with the accompanying drawings, in which like reference characters refer to like parts throughout, and in which.

DETAILED DESCRIPTION

Embodiments of the present invention have application where reducing the time needed to determine the smallest and second-smallest values in a list of values is important. One such application is in low-density parity check (LDPC) decoding in the read channel of a data storage device, where faster decoding translates to faster data access.

An LDPC decoder may operate using the Min-Sum algorithm. A Min-Sum LDPC decoder operates as follows at each Check Node Unit:

Given unsigned magnitude values $R_0, R_1, \ldots, R_m$, find Min1 and Min2 such that:
  Min1=min($R_i$, i={0,1, . . . , m})
  Min1Loc such that $R_{Min1Loc}$=Min1
  Min2=min($R_i$, i≠Min1Loc)

Number of entries in the list, m, depends on the "row weight" of the code, and is usually between 10 through 50. A cascaded tree of Min1/Min2 operators may be used to evaluate up to 50 inputs to find Min1 (the smallest of the inputs) and Min2 (the second-smallest of the inputs).

Because reducing data access time is important, it is desirable to speed up LDPC decoding using the Min-Sum algorithm by more quickly finding the smallest and second-smallest values of the $R_m$ inputs.

Figure 1:
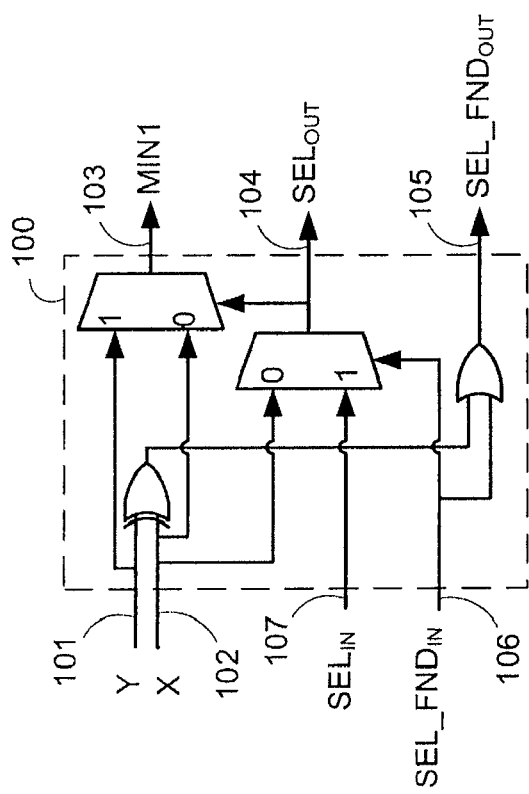
FIG. 1 is a logical representation of a bitwise comparator.

Any two values may be compared bitwise to find the smaller of those two values. If two numbers have different MSBs, then the number with the smaller MSB is the smaller number. Therefore two numbers may be compared starting with their MSBs and, as long as the compared bits are the same, continuing the comparison with the next-MSB until the compared bits are different. Known logic unit 100 for comparing two bits is shown in FIG. 1.

In MSB-first comparator 100, each input X (102) and Y (101) may be one input bit. Output MIN1 (103) represents the minimum of X and Y. Output $SEL_=$(104) is the index of the selection evaluated to be the minimum, where input Y (101) is the 0th input and input X (102) is the 1st input, with $SEL_{OUT}$=0 if there is no minimum (X=Y). In other words, $SEL_=$ is the boolean result of X>Y—if X>Y is true, $SEL_{OUT}$=1 and if X>Y is false (X≤Y), $SEL_{OUT}$=0. Output $SEL\_FND_{OUT}$ (105) is a boolean Select Found signal indicating that a result has been found, and is equal to the OR of $SEL\_FND_{IN}$ (106) which is $SEL\_FND_{OUT}$ from the previous bit (meaning a result was or was not already found previously) with boolean result of X≠Y (meaning that a result has—X≠Y is .TRUE.—or has not—X=Y, or X≠Y is .FALSE.—been found at the current bit). $SEL_{IN}$ (107) is $SEL_{OUT}$ from the previous bit.

Figure 2:
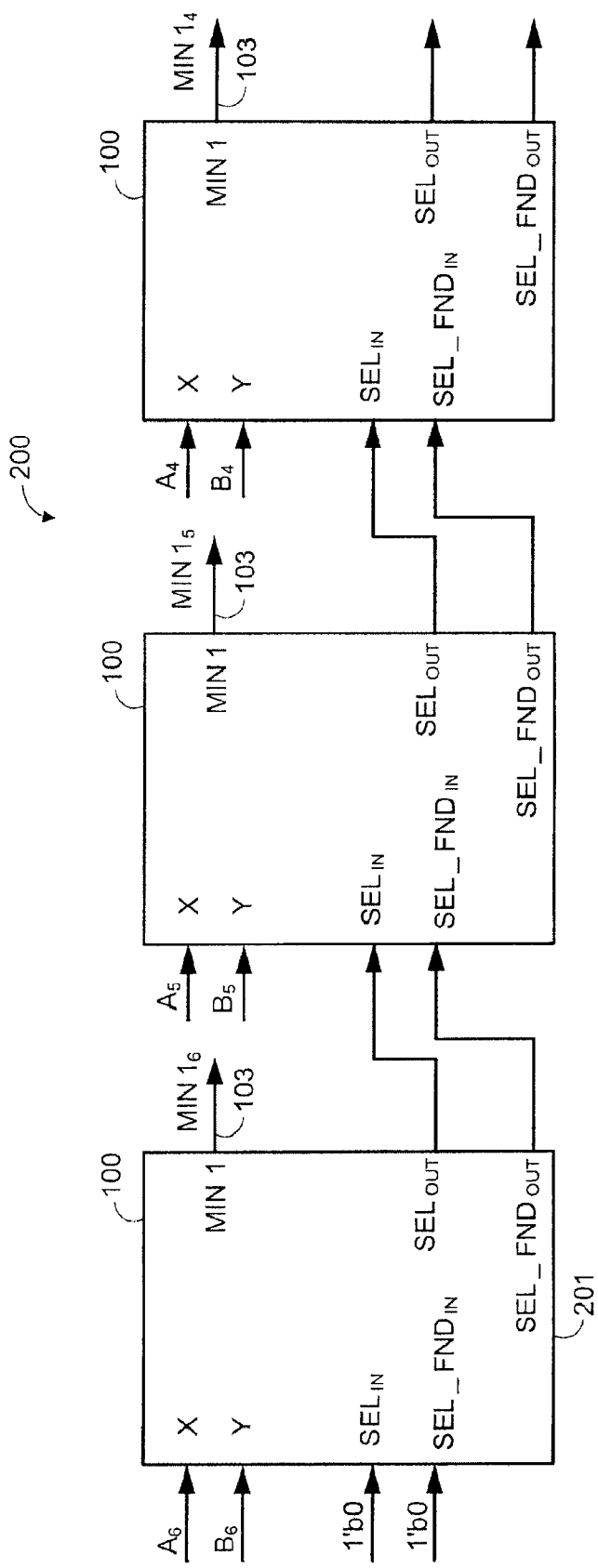
FIG. 2 is a schematic representation of a cascade of bitwise comparators of the type shown in FIG. 1.

A cascade 200 of MSB-first comparators 100 is shown in FIG. 2. Cascade 200 represents the first three units of a seven-unit cascade for finding the minimum as between two 7-bit numbers A[6:0] and B[6:0]. For the first MSB-first comparator 201 in cascade 200, comparing MSBs $A_6$ and $B_6$, $SEL_{IN}$ and $SEL\_FND_{IN}$ are arbitrarily set to logic "0". Output MIN1 (103) from each nth stage 100 represents the nth most significant bit MIN1, of the smallest number Min1.

Figure 3:
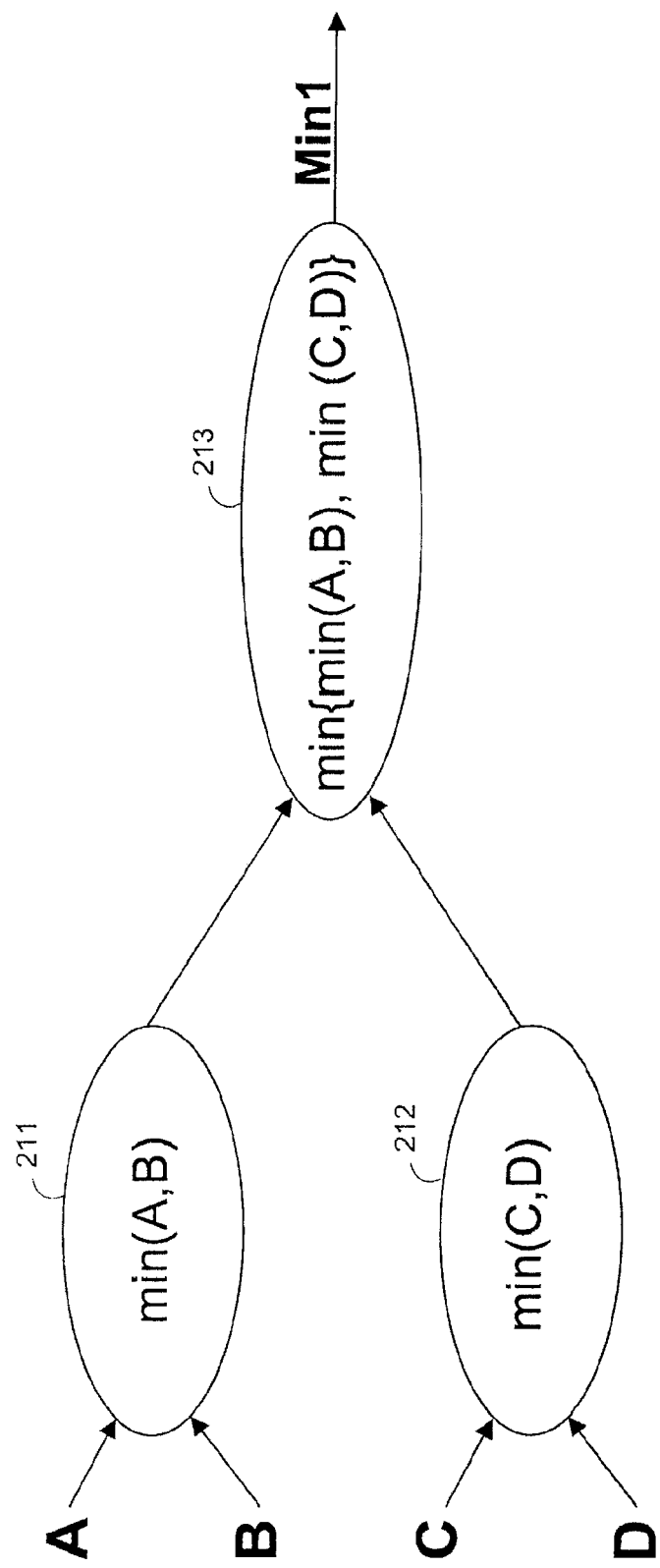
FIG. 3 is a logical representation of a cascaded tree of comparators.
Figure 4:
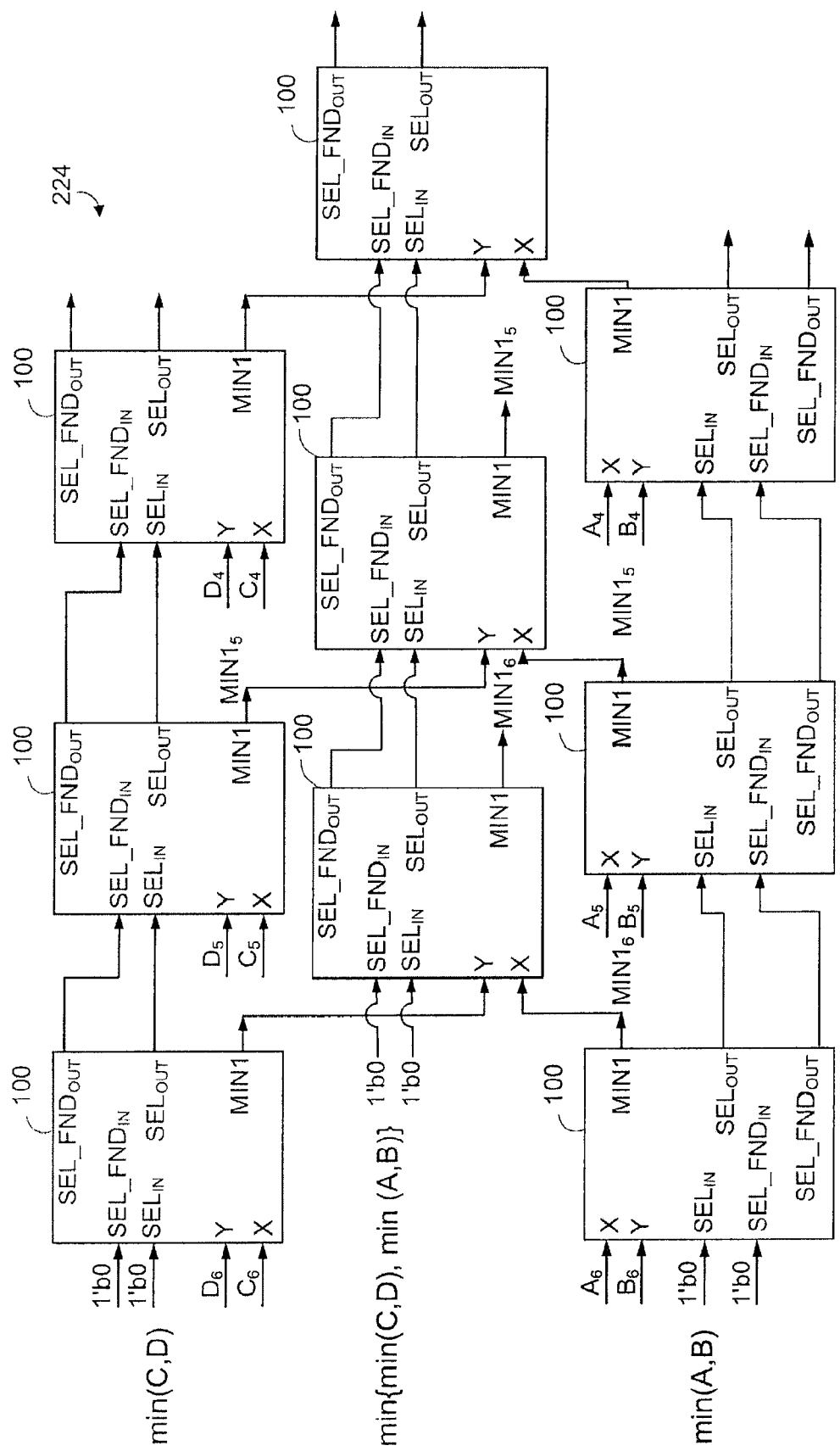
FIG. 4 is schematic representation of a cascaded tree of bitwise comparators that may implement the logical tree of FIG. 3.

Given four inputs A, B, C, D, Min1=min(A,B,C,D) may be found by finding min(A,B) (211) and min(C,D) (212) and then finding min{min(A,B),min(C,D)} (213) as shown in FIG. 3. Cascades 221, 221, 221 of MSB-first comparators 100 may be used to perform that evaluation 220 as shown in FIG. 4. Moreover, an arrangement as shown in FIG. 4 can provide individual bits MIN1, of Min1 even before the final selection of Min1 is made.

In performing the evaluation of FIGS. 3 and 4, the evaluation of min(A,B) (211) will reveal that one of A and B is a relative minimum and one of A and B is a relative maximum. Similarly, the evaluation of min(C,D) (212) will reveal that one of C and D is a relative minimum and one of C and D is a relative maximum. Once the absolute minimum is found in the second-stage comparison min{min(A,B), min(C,D)} (213), if the result came from a first one of the first-stage comparisons 211, 212, the second-smallest of A, B, C and D is either the relative minimum from the second one of the first-stage comparisons 211, 212, or possibly the relative maximum from the first one of the first-stage comparisons 211, 212, which might be smaller than either input to the second one of the first-stage comparisons 211, 212 even though it is larger than the relative minimum from the first one of the first-stage comparisons 211, 212.

Figure 5:
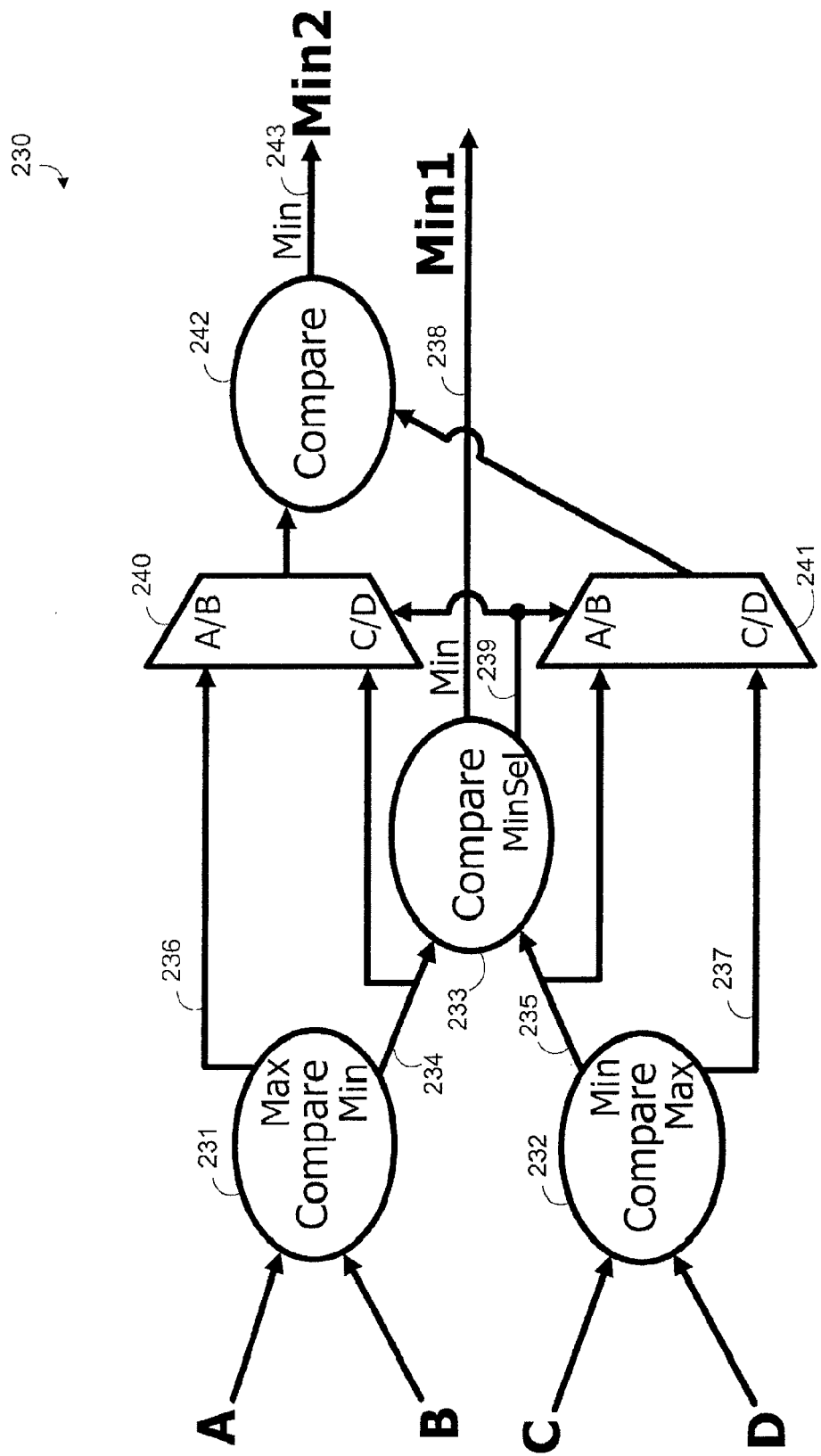
FIG. 5 is a logical representation of the determination of minimum and next-to-minimum values from a group of four values.

FIG. 5 shows an arrangement 230 for resolving the second-smallest value Min2 from among the three candidates. First-stage comparisons 231, 232 are similar to first-stage comparisons 211, 212 except that they output relative maxima 236, 237 in addition to relative minima 234, 235. Second-stage comparison 233 accepts as inputs the relative minima 234, 235 to output Min1 (238) but also to output a selection signal MinSel (239) that indicates whether output 238 derived from first-stage comparison 231 or first-stage comparison 232. Outputs 234, 236 from first-stage comparison 231 are input to multiplexer 240, while outputs 235, 237 from first-stage comparison 232 are input to multiplexer 241.

If MinSel signal 239 indicates that the absolute minimum 238 derived from the A/B first-stage comparison 231, then second-smallest value Min2 is either the relative minimum 235 from C/D first-stage comparison 232 or the relative maximum 236 from A/B first-stage comparison 231. In such a case, MinSel signal 239 causes multiplexers 240, 241 to select their respective A/B inputs, sending relative minimum 235 and relative maximum 236 to comparison 242 to determine second-smallest output Min2 (243).

On the other hand, if MinSel signal 239 indicates that the absolute minimum 238 derived from the C/D first-stage comparison 232, then second-smallest value Min2 is either the relative minimum 234 from A/B first-stage comparison 231 or the relative maximum 237 from C/D first-stage comparison 232. In such a case, MinSel signal 239 causes multiplexers 240, 241 to select their respective C/D inputs, sending relative minimum 234 and relative maximum 237 to comparison 242 to determine second-smallest output Min2 (243).

However, in arrangement 230, determination of Min2 (243) cannot begin until completion of the determination 233 of Min1 (238) to generate MinSel signal 239.

Figure 6:
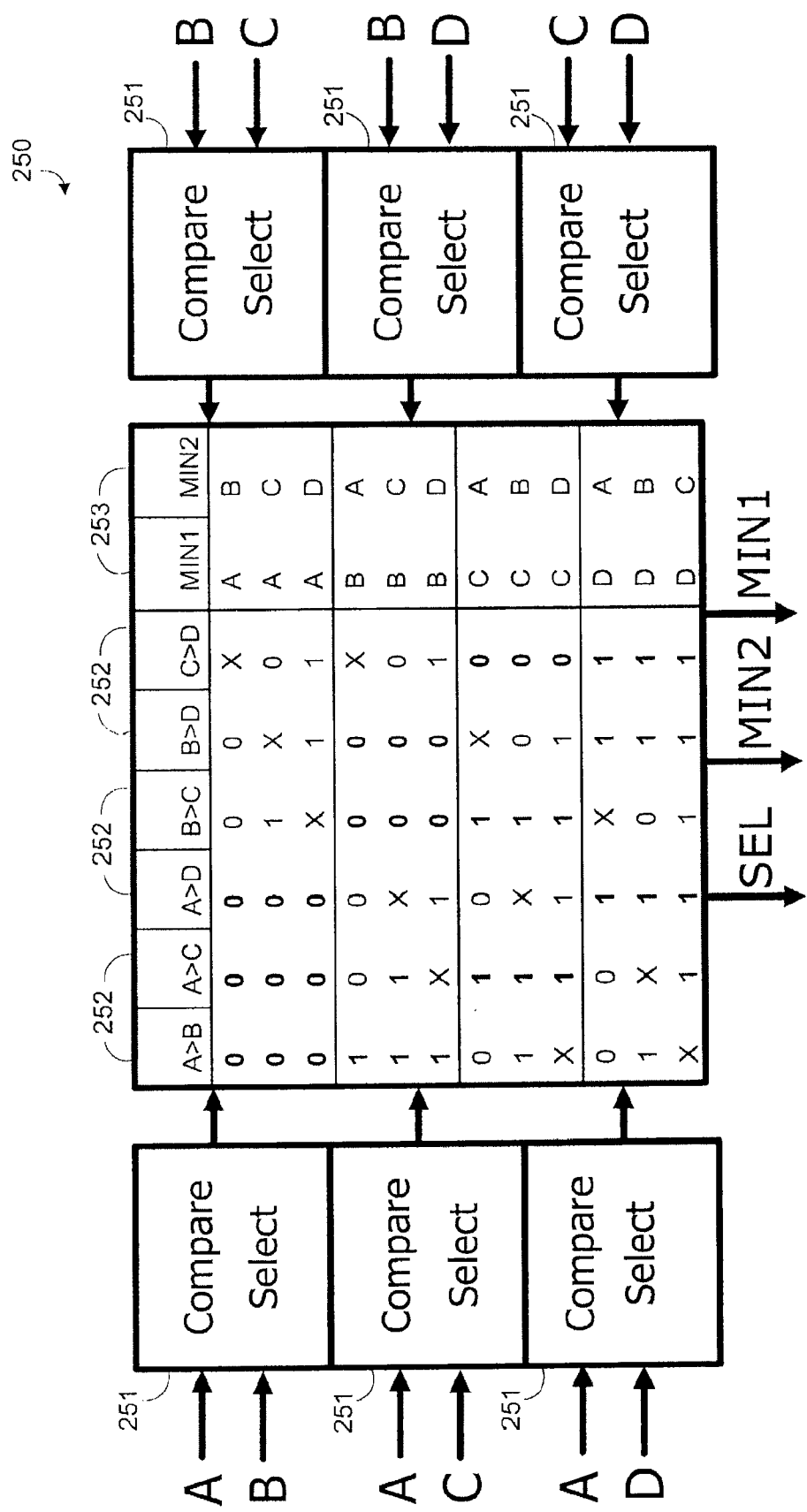
FIG. 6 shows a look-up table implementation of the determination of minimum and next-to-minimum values from a group of four values.

Another arrangement for determining Min1 and Min2 from four inputs A, B, C, D is a look-up table 250 as shown in FIG. 6. The four values are input to compare/select units 251 to generate comparisons of A to each of B, C and D, B to each of C and D, and C to D. In each of columns 252, a "0" indicates that the first value indicated at the top of column is less than the second value, a "1" indicates that the first value indicated at the top of column is greater than the second value, and an "X" indicates a "Don't Care" situation. The results for Min1 and Min2 are indicated in columns 253. For example, on the first row, where A is less than each of the other three values B, C and D, and B is less than each of C and D, then we know that A is the minimum or smallest value and B is the next-to-minimum or second-smallest value, and we do not care whether C is less than D or vice-versa. In this approach, however, all results are available simultaneously.

Figure 7:
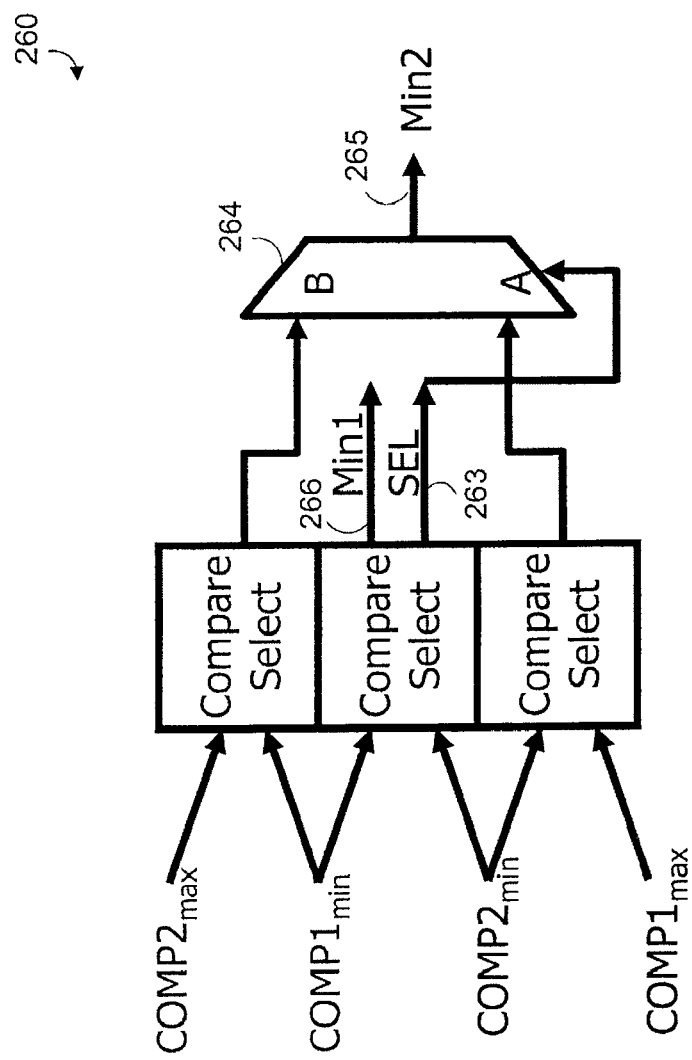
FIG. 7 shows a carry-select comparator approach for the determination of minimum and next-to-minimum values from a group of four values.

A carry-select comparator approach 260 is shown in FIG. 7. This approach is similar in some ways to arrangement 230 of FIG. 5 and assumes that comparisons like first-stage comparisons 231, 232 have taken place, classifying the four input values as $COMP1_{min}$, $COMP1_{max}$, $COMP2_{min}$ and $COMP2_{max}$. Arrangement 260 compares $COMP1_{min}$ to $COMP2_{min}$ to determine Min1 and then compares $COMP1_{min}$ to $COMP2_{max}$ and $COMP2_{min}$ to $COMP1_{max}$ to determine Min2 (265) using select signal SEL (263) to cause multiplexer 264 to select the $COMP2_{min}$ to $COMP1_{max}$ comparison if $COMP1_{min}$ is Min1, or the $COMP1_{min}$ to $COMP2_{max}$ comparison if $COMP2_{min}$ is Min1.

Here again, determination of Min2 (265) cannot begin until completion of the determination of Min1 (266) to generate SEL signal 263.

It can be shown in the comparison, starting at the MSB, of two numbers, each of which is the respective minimum within another pair of numbers to determine the absolute minimum (Min1) of those four numbers, that as long as the bits of the two numbers being compared are the same, then the corresponding bits of the absolute minimum (Min1) and the next-to-minimum or next-smallest (Min2) must be the same. Otherwise, the condition that the bits of the two numbers being compared are the same has been broken and Min1, and therefore Min2, would already have been determined.

Accordingly, in a comparison of $COMP1_{min}$ to $COMP2_{min}$, at any bit position i, if $SEL\_FIND_{IN,i}=0$, meaning that the minimum as between $COMP1_{min}$ and $COMP2_{min}$ has not yet been determined in previous bits, and $COMP1_{min,i}=COMP2_{min,i}$, meaning that the minimum is not determined by the current bit, then $COMP1_{min,i}$ (which is the same as $COMP2_{min,i}$) is propagated as both $Min1_i$ and $Min2_i$.

Figure 8:
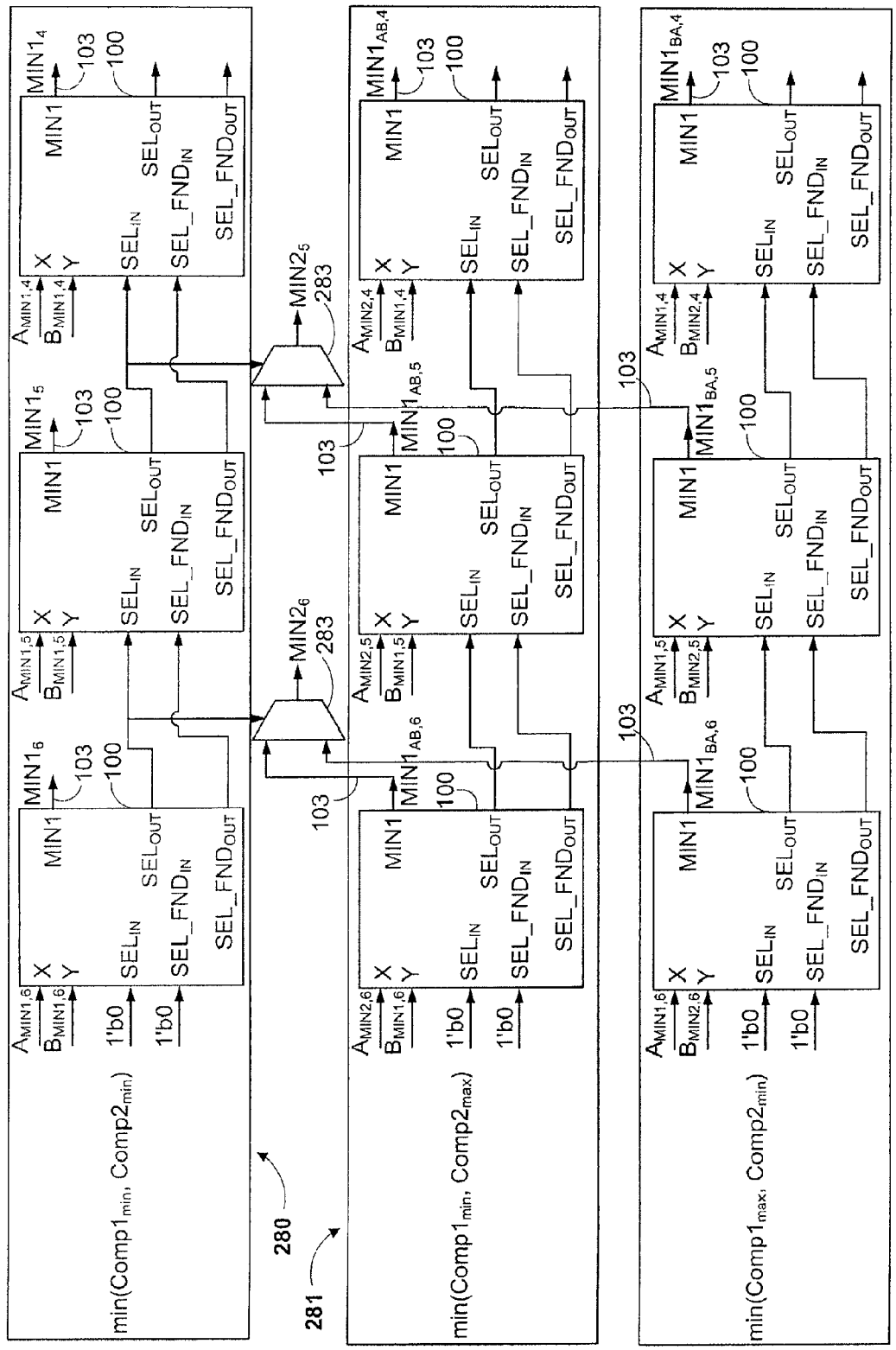
FIG. 8 is a schematic representation of a cascaded-bitwise-comparator circuit for the determination of minimum and next-to-minimum values from a group of four values.

An embodiment of a circuit implementation according to the invention is shown in FIG. 8. A respective cascade 280, 281, 282 of MSB-first comparators 100 is shown for each of the comparisons discussed above in connection with FIG. 7. Thus, cascade 280 as shown represents the first three units of a seven-unit cascade for finding the minimum as between two 7-bit numbers $COMP1_{min}[6:0]$ and $COMP2_{min}[6:0]$, cascade 281 as shown represents the first three units of a seven-unit cascade for finding the minimum as between two 7-bit numbers $COMP1_{min}[6:0]$ and $COMP2_{max}[6:0]$, and cascade 282 as shown represents the first three units of a seven-unit cascade for finding the minimum as between two 7-bit numbers $COMP1_{max}[6:0]$ and $COMP2_{min}[6:0]$.

The individual bits of Min1[6:0] are output at outputs 103 of the individual units 100 of cascade 280. Outputs 103 of individual units 100 of cascade 281 are the individual bits of Min2[6:0] if $COMP2_{min}$ is Min1, while outputs 103 of individual units 100 of cascade 282 are the individual bits of Min2[6:0] if $COMP1_{min}$ is Min1. The choice between output 103 of each pair of respective units 100 of cascades 281, 282 is made by multiplexer 283 under control of the $SEL_{OUT}$ output of the corresponding unit 100 of cascade 280. Outputs 103 of cascade 281 are chosen as the bits of MIN2 if $COMP1_{min,i}$ is greater than $COMP2_{min,i}$, while outputs 103 of cascade 282 is chosen as the bits of MIN2 if $COMP2_{min,i}$ is greater than $COMP1_{min,i}$. As described above, until Min1 is determined, an individual output $Min2_i$ is the same from cascade 281 and cascade 282 for the reasons given, and thus can be propagated as the ith bit of Min2 as soon as it is available.

As discussed so far, Min1 and Min2 have been the minimum and next-to-minimum of four inputs. For a larger number of inputs, a cascade 290 of four-to-two comparisons 291 can be made as shown in FIG. 9.

Figure 10:
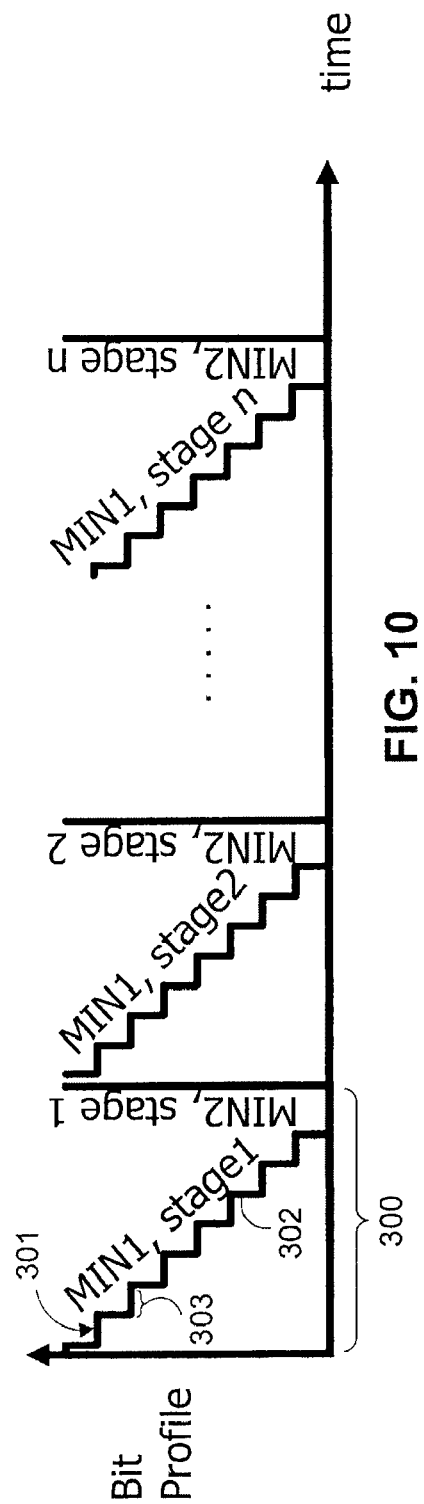
FIG. 10 is a timing diagram showing the delay in previously known arrangements.

The timing effect of not being able to determine any portion of Min2 at any stage until the determination of Min1 for that stage is complete is shown in FIG. 10. Each stepwise trace in FIG. 10 shows the derivation of the complete value of Min1 or Min2, with each step representing one bit. Thus, for 8-bit words, the derivation of Min2 cannot start until the least-significant bit (LSB) of Min1 has been found for that stage. Therefore, in each stage, there is a delay in propagating any bits of Min2 equal to as long as the number of bits (e.g., 8) per word multiplied by the time necessary to determine one bit. This delay is generally on the order of several tens of picoseconds per bit, but is a function of the system clock and other considerations such as, e.g., process technology, operating temperature, or voltage. In particular, FIG. 10 shows a delay 300 of approximately 8Δt from the beginning 301 of the determination 302 of Min1, where Δt is the duration of the determination of each bit (i.e., the duration of each step 303). This assumes that the Min1 is not determined until the last bit is checked, but if it were determined sooner, then the delay would be only nΔt, where n represents the number of bits that had to be checked to determine Min1.

Figure 9:
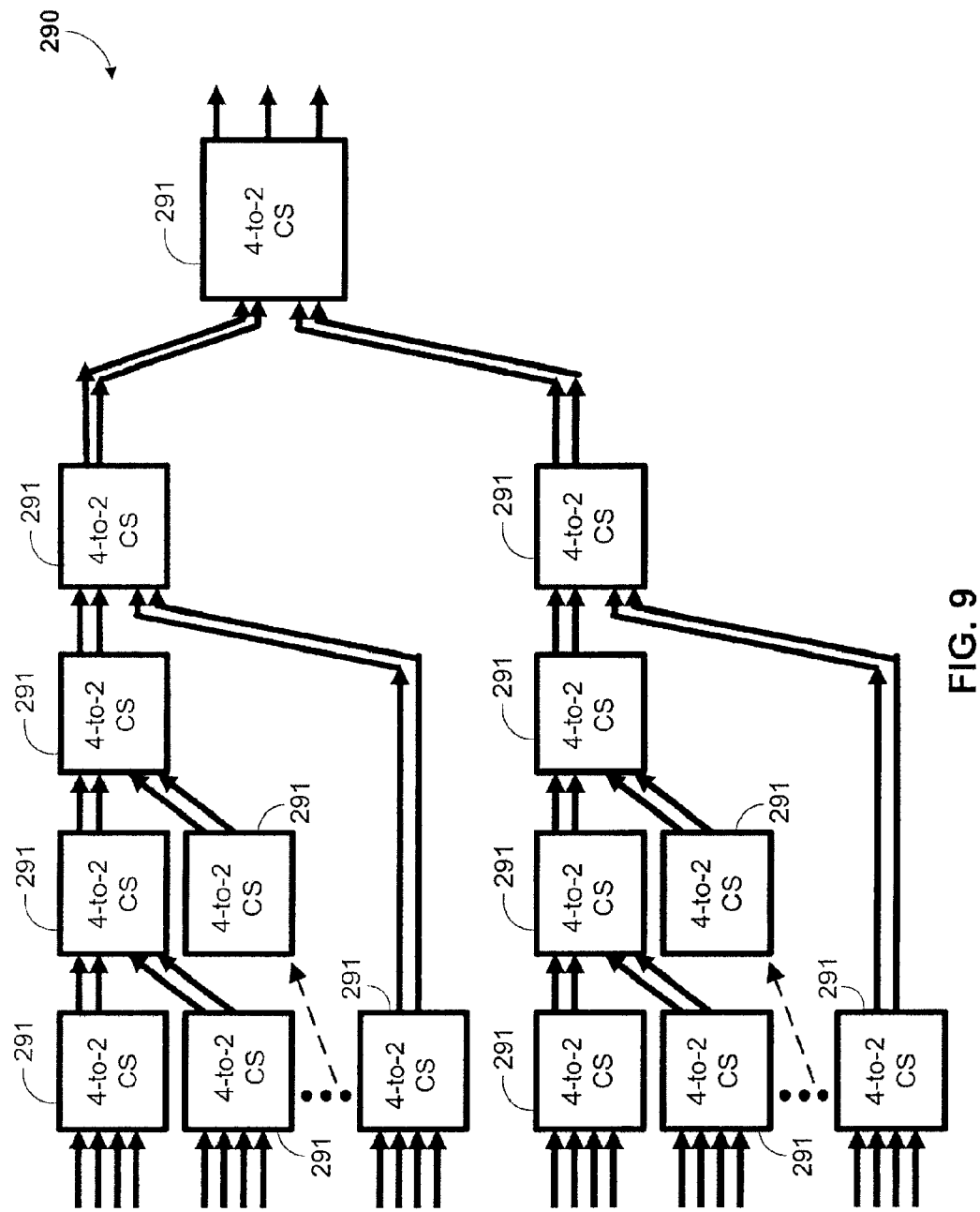
FIG. 9 is a schematic representation of a cascade of four-to-two comparisons as in FIG. 8 for the determination of minimum and next-to-minimum values from a larger group of values.

FIG. 10 also shows that in a multistage comparison such as in FIG. 9, the Min1 determination for each stage cannot begin until the Min1 and Min2 determinations in the previous stage are complete, and that within each stage, the same nΔt delay is incurred for determination of Min2 in that stage because of the need to first determine Min1.

Figure 11:
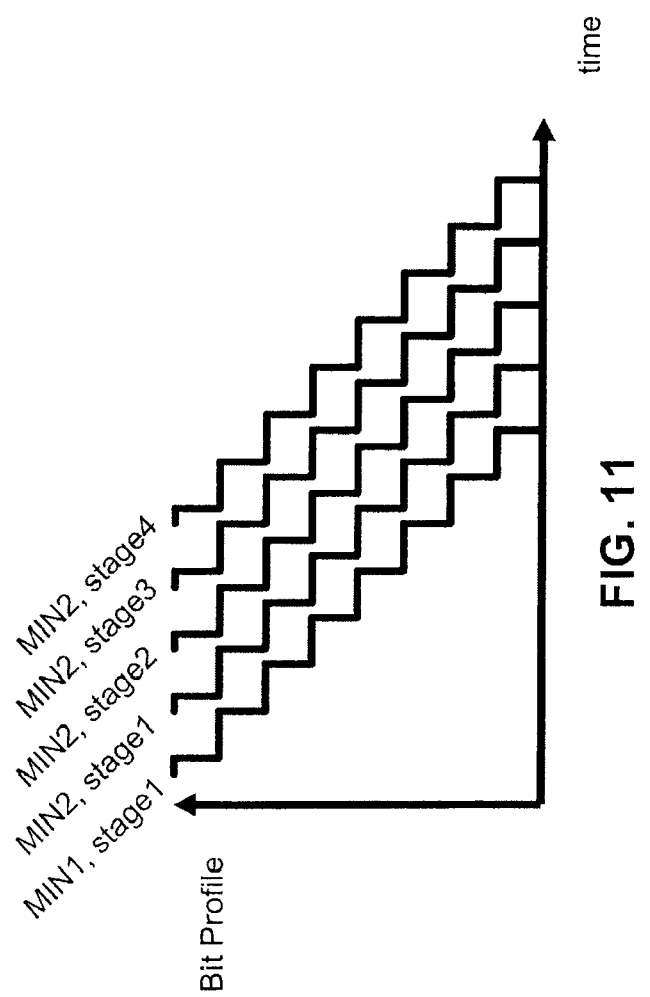
FIG. 11 is a timing diagram showing amelioration of the delay of FIG. 10 by the present invention.

On the other hand, the timing in accordance with the present invention is shown in FIG. 11. Here, because bits of Min2 (as well as bits of Min1) can be propagated almost immediately, and because all comparisons are occurring in bitwise fashion, not only can bits of Min2 of the current stage be determined almost immediately, but those bits, once determined, can be propagated to the next stage, where the bitwise comparisons can begin almost immediately, resulting in the minimal delays shown in FIG. 11.

Thus it is seen that a method and circuitry for determining the minimum and next-to-minimum values from a group of input values, has been provided. As discussed above, this technique can be used in LDPC decoding of the read channel of a data storage device, although other arrangements also are possible.

Figure 12:
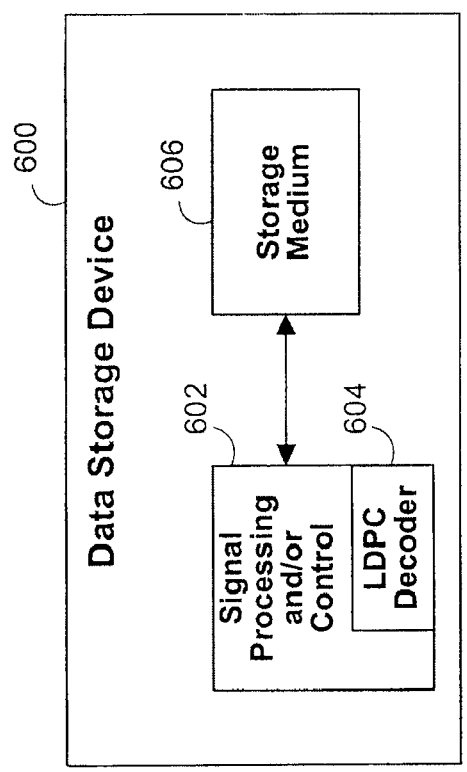
FIG. 12 is a block diagram of an exemplary data storage device having an LDPC decoder incorporating the present invention.

Referring now to FIG. 12, an exemplary implementation of the present invention is shown. The present invention can be implemented in a data storage device 600. The present invention may implement either or both signal processing and/or control circuits, which are generally identified in FIG. 12 at 602. In some implementations, the signal processing and/or control circuit 602 and/or other circuits (not shown) in the data storage device 600 may process data, perform coding and/or encryption, perform calculations, and/or format data that is output to and/or received from a storage medium 606. In accordance with an embodiment of the invention, control circuit 602 may include an LDPC decoder 604 which includes circuitry in accordance with the invention for finding the smallest and second-smallest values in a group of values.

It will be understood that the foregoing is only illustrative of the principles of the invention, and that the invention can be practiced by other than the described embodiments, which are presented for purposes of illustration and not of limitation, and the present invention is limited only by the claims which follow.

What is claimed is:

1. A method for determining, from among four values represented by four signals input to a circuit, where a first two of said four values have been compared to determine a first minimum and a first maximum and a second two of said four values have been compared to determine a second minimum and a second maximum, which of said four values is a minimum value and which of said four values is a next-to-minimum value, said method comprising:

comparing bitwise, in a first cascade of first bitwise comparators of said circuit, a signal representing said first minimum to a signal representing said second minimum, from most-significant bit to least-significant bit, each bitwise comparison of said signal representing said first minimum to said signal representing said second minimum providing a bit of a signal representing said minimum value and a respective bit of a bitwise selection signal;

comparing bitwise, in a second cascade of second bitwise comparators of said circuit, a signal representing said first maximum to said signal representing said second minimum, from most-significant bit to least-significant bit, each bitwise comparison of said signal representing said first maximum to said signal representing said second minimum providing a first respective candidate bit of a signal representing said next-to-minimum value;

comparing bitwise, in a third cascade of third bitwise comparators of said circuit, a signal representing said second maximum to said signal representing said first minimum, from most-significant bit to least-significant bit, each bitwise comparison of said signal representing said second maximum to said signal representing said first minimum providing a second respective candidate bit of said signal representing said next-to-minimum value; and selecting between said first and second respective candidate bits of said signal representing said next-to-minimum value in a set of respective multiplexers, each selection under control of said respective bit of said bitwise selection signal.

2. The method of claim 1 wherein said comparing bitwise, in said circuit, said signal representing said first minimum to said signal representing said second minimum comprises:

comparing bits of said first minimum and said second minimum starting at most significant bits and proceeding bitwise through bits of lesser significance until corresponding bits of a certain significance are different; and when said corresponding bits of a certain significance are different, declaring said one of said first minimum and said second minimum having a "0" as a bit of said certain significance to be said minimum value, and declaring said one of said minimum and next-to-minimum values having a "1" as a bit of said certain significance to be said next-to-minimum value.

3. The method of claim 2 comprising, when said corresponding bits of said certain significance are identical, propagating said identical bits as bits of both said minimum value and said next-to-minimum value.

4. A low-density parity check decoding method comprising determining a minimum and a next-to-minimum value from an original group of four values using the method of claim 1.

5. A method for determining, from among a group of values represented by a group of signals input to a circuit, which value in said group of values is a minimum value and which value in said group of values is a next-to-minimum value, said method comprising:

making a series of comparisons to determine a minimum value and a next-to-minimum value out of four values, including comparing, in said circuit, respective signals representing a first two of said four values to determine a first minimum and a first maximum, and comparing respective signals representing a second two of said four values to determine a second minimum and a second maximum, each comparison in said series of comparisons comprising:

comparing bitwise, in a first cascade of first bitwise comparators of said circuit, a signal representing said first minimum to a signal representing said second minimum, from most-significant bit to least-significant bit, each bitwise comparison of said signal representing said first minimum to said signal representing said second minimum providing a bit of a signal representing said minimum value out of said four values and a respective bit of a bitwise selection signal;

comparing bitwise, in a second cascade of second bitwise comparators of said circuit, a signal representing said first maximum to said signal representing said second minimum, from most-significant bit to least-significant bit, each bitwise comparison of said signal representing said first maximum to said signal representing said second minimum providing a first respective candidate bit of a signal representing said next-to-minimum value out of said four values;

comparing bitwise, in a third cascade of third bitwise comparators of said circuit, a signal representing said second maximum to said signal representing said first minimum, from most-significant bit to least-significant bit, each bitwise comparison of said signal representing said second maximum to said signal representing said first minimum providing a second respective candidate bit of said signal representing said next-to-minimum value out of said four values; and selecting between said first and second respective candidate bits of said signal representing said next-to-minimum value out of said four values in a set of respective multiplexers, each selection under control of said respective bit of said bitwise selection signal.

6. The method of claim 5 wherein said comparing bitwise, in said circuit, said signal representing said first minimum to said signal representing said second minimum comprises:

comparing bits of said first minimum and said second minimum starting at most significant bits and proceeding bitwise through bits of lesser significance until corresponding bits of a certain significance are different; and when said corresponding bits of a certain significance are different, declaring said one of said first minimum and said second minimum having a "0" as a bit of said certain significance to be said minimum value, and declaring said one of said minimum and next-to-minimum values having a "1" as a bit of said certain significance to be said next-to-minimum value.

7. The method of claim 6 comprising, when said corresponding bits of said certain significance are identical, propagating said identical bits as bits of both said minimum value and said next-to-minimum value.

8. A low-density parity check decoding method comprising determining a minimum and a next-to-minimum value from an original group of values using the method of claim 5.

9. A low-density parity check decoder comprising:

comparator circuitry for determining, from among four values, where a first two of said four values have been compared to determine a first minimum and a first maximum and a second two of said four values have been compared to determine a second minimum and a second maximum, which of said four values is a minimum value and which of said four values is a next-to-minimum value, said comparator circuitry comprising:

a first cascade of first bitwise comparators for comparing said first minimum to said second minimum from most-significant bit to least-significant bit, each of said first bitwise comparators outputting a bit of said minimum value and a respective bit of a bitwise selection signal;

a second cascade of second bitwise comparators for comparing said first maximum to said second minimum from most-significant bit to least-significant bit, each of said second bitwise comparators outputting a first respective candidate bit of said next-to-minimum value;

a third cascade of third bitwise comparators for comparing said second maximum to said first minimum from most-significant bit to least-significant bit, each of said third bitwise comparators outputting a second respective candidate bit of said next-to-minimum value; and a set of respective multiplexers each having as data inputs said first and second respective candidate bits of said next-to-minimum value, and each having as a control input said respective bit of said bitwise selection signal.

10. The low-density parity check decoder of claim 9 wherein:

said bitwise comparators in said first cascade compare bits of said first minimum and said second minimum starting at most significant bits and proceeding bitwise through bits of lesser significance until corresponding bits of a certain significance are different; said first cascade further comprising:

circuitry that, when said corresponding bits of a certain significance are different, declares one of said first minimum and said second minimum having a "0" as a bit of said certain significance to be said minimum value, and declaring one of said minimum and next-to-minimum values having a "1" as a bit of said certain significance to be said next-to-minimum value.

11. The low-density parity check decoder of claim 10 comprising circuitry that, when said corresponding bits of said certain significance are identical, propagates said identical bits as bits of both said minimum value and said next-to-minimum value.

12. A low-density parity check decoder comprising:

comparator circuitry for determining which value in a group of values is a minimum value and which value in said group of values is a next-to-minimum value, said comparator circuitry comprising:

a tree of comparator subcircuits each of which determines a minimum value and a next-to-minimum value out of four values, where a first two of said four values have been compared to determine a first minimum and a first maximum and a second two of said four values have been compared to determine a second minimum and a second maximum, each of said comparator subcircuits comprising:

a first cascade of first bitwise comparators for comparing said first minimum to said second minimum from most-significant bit to least-significant bit, each of said first bitwise comparators outputting a bit of said minimum value out of said four values and a respective bit of a bitwise selection signal;

a second cascade of second bitwise comparators for comparing said first maximum to said second minimum from most-significant bit to least-significant bit, each of said second bitwise comparators outputting a first respective candidate bit of said next-to-minimum value out of said four values;

a third cascade of third bitwise comparators for comparing said second maximum to said first minimum from most-significant bit to least-significant bit, each of said third bitwise comparators outputting a second respective candidate bit of said next-to-minimum value out of said four values; and a set of respective multiplexers each having as data inputs said first and second respective candidate bits of said next-to-minimum value out of said four values, and each having as a control input said respective bit of said bitwise selection signal.

13. The low-density parity check decoder of claim 12 wherein:

said bitwise comparators in said first cascade compare bits of said first minimum and said second minimum starting at most significant bits and proceeding bitwise through bits of lesser significance until corresponding bits of a certain significance are different; said first cascade further comprising:

circuitry that, when said corresponding bits of a certain significance are different, declares one of said first minimum and said second minimum having a "0" as a bit of said certain significance to be said minimum value, and declaring one of said minimum and next-to-minimum values having a "1" as a bit of said certain significance to be said next-to-minimum value.

14. The low-density parity check decoder of claim 13 comprising circuitry that, when said corresponding bits of said certain significance are identical, propagates said identical bits as bits of both said minimum value and said next-to-minimum value.

* * * * *